US006366187B1

(12) United States Patent
Malingowski et al.

(10) Patent No.: US 6,366,187 B1
(45) Date of Patent: Apr. 2, 2002

(54) SUPPORT AND ALIGNMENT STRUCTURE FOR MAGNETIC TRIP DEVICE

(75) Inventors: Richard Paul Malingowski, Finleyville; Robert Michael Slepian, Murrysville; Teresa Inez Hood, Pittsburgh; Lance Gula, Clinton; Trent Allen Chontas; Mark O. Zindler, both of Pittsburgh; Joseph Humbert, Monaca, all of PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/525,781

(22) Filed: Mar. 15, 2000

(51) Int. Cl.[7] .................................................. H01L 9/00

(52) U.S. Cl. ............................ 335/172; 335/9; 335/21; 335/38; 335/174; 335/175

(58) Field of Search ........................... 335/6, 9, 10, 21, 335/35, 36, 38, 172–176

(56) References Cited

U.S. PATENT DOCUMENTS 5,831,501 A 11/1998 Kolberg et al.

*Primary Examiner*—Ramon M. Barrera
(74) *Attorney, Agent, or Firm*—Martin J. Moran

(57) ABSTRACT

A plunger assembly support structure for a molded case circuit breaker magnetic trip mechanism for aligning a trip mechanism plunger assembly. The plunger assembly support structure includes a base member assembly having a plurality of guide members, and a plunger carriage assembly slidably disposed adjacent to said base member assembly.

18 Claims, 7 Drawing Sheets

SUPPORT AND ALIGNMENT STRUCTURE FOR MAGNETIC TRIP DEVICE

BACKGROUND OF THE INVENTION

1. Field of the Invention

This invention relates to a magnetic trip device for circuit breakers and, more specifically, to a support structure which maintains the alignment of a plunger in the magnetic trip device.

2. Description of the Prior Art

Molded case circuit breakers are well known in the art as exemplified by U.S. Pat. No. 5,927,484 to Malingowski issued Jul. 27, 1999 and by U.S. Pat. No. 4,503,408 issued Mar. 5, 1985 to Mrenna et.al., entitled "Molded Case of Circuit Apparatus Having Trip Bar With Flexible Armature Interconnection" assigned to the assignee of the present application. The foregoing are incorporated herein by reference.

In molded case circuit breakers in which the power contacts, operating mechanism, and trip unit are mounted inside of a molded plastic insulative housing, a common type of magnetic trip device is a solenoid which includes a stationary core through which the current in the protected circuit is passed. The current passing through the stationary core creates a magnetic field. When there a very high instantaneous currents, such as those associated with a short circuit, the magnetic field intensifies. A plunger assembly, having a movable core and a plunger tab which engages the trip latch on the operating mechanism, is partially disposed within the stationary core. Typically, a spring provides a limited force biasing the movable core away from the stationary core and preventing the plunger from engaging the trip latch. The force of the spring is overcome by the magnetic field generated by the stationary core during a short circuit. That is, when a short circuit occurs, the current in the stationary core creates a magnetic field strong enough to overcome the moveable core spring thereby allowing the moveable core to move toward the stationary core and causing the plunger to engage the trip latch.

The amount of current required to trip the device can be controlled by adjusting the amount of separation between the plunger assembly and stationary core. When the plunger assembly is located closer to the stationary core, a weaker magnetic field, and therefore a lower current, is required to draw the plunger assembly toward the stationary core to trip the device. In order to adjust the trip condition, the plunger assembly is mounted in a plunger assembly support structure having a base and a moveable plunger carriage. The carriage allows the plunger assembly, including the moveable core, to be moved relative to the stationary core. A carriage is used so that adjusting the gap between the moveable core and the stationary core does not impact on the compression of the moveable core biasing spring. The moveable plunger carriage is coupled to an adjustment mechanism to address the initial gap between the plunger assembly and the stationary core.

Plunger assembly support structures of the prior art were loosely disposed within plunger carriage cavities in the circuit breaker housing. Such support structures did not include a means to maintain the alignment of the plunger carriage relative to the base or the stationary core. As such, the plunger carriage could wobble in the plunger carrier cavity, resulting in a mis-alignment of the plunger assembly. Additionally, through repeated use, the moveable core on prior art magnetic trip devices can rotate allowing the plunger tab to move away from the trip bar actuator arm.

There is a need, therefore, for a plunger assembly support structure for a molded case circuit breaker magnetic trip mechanism which maintains the orientation of the plunger carriage in the circuit breaker housing.

There is a further need for a plunger assembly support structure for a molded case circuit breaker magnetic trip mechanism which provides a means for maintaining the moveable core alignment with the stationery core.

There is a further need for a plunger assembly support structure for a molded case circuit breaker magnetic trip mechanism which corrects rotation of the plunger tab on the moveable core.

SUMMARY OF THE INVENTION

These needs and others are satisfied by the invention which provides a plunger assembly support structure for a magnetic trip unit which includes a plurality of guides which maintain the orientation of the plunger carriage. This invention further provides a plunger guide which corrects rotation of the moveable core of the solenoid.

A molded case circuit breaker includes at least one pair of separable main contacts. The main contacts are disposed in the circuit breaker housing. The circuit breaker may be tripped manually by a handle or by a magnetic trip device. The magnetic trip device includes a rotating trip bar, which is actuated by a plunger assembly, a moveable plunger assembly and a stationary core. The stationary core is in disposed between, and in electrical communication with, the main contact and the load side of the circuit breaker. The plunger assembly includes a moveable core, partially disposed within the stationary core. The plunger assembly is disposed within a plunger assembly support structure having a base assembly and a movable plunger carriage. The base assembly is coupled to the circuit breaker housing. The plunger carriage is coupled to the base. The base includes a plurality of guides which align the plunger carriage and plunger with the trip bar. The base assembly further includes a conical indentation which reorients the plunger if it rotates in the plunger carriage.

BRIEF DESCRIPTION OF THE DRAWINGS

A full understanding of the invention can be gained from the following description of the preferred embodiments when read in conjunction with the accompanying drawings in which.

DETAILED DESCRIPTION OF THE PREFERRED EMBODIMENTS

Figure 1:
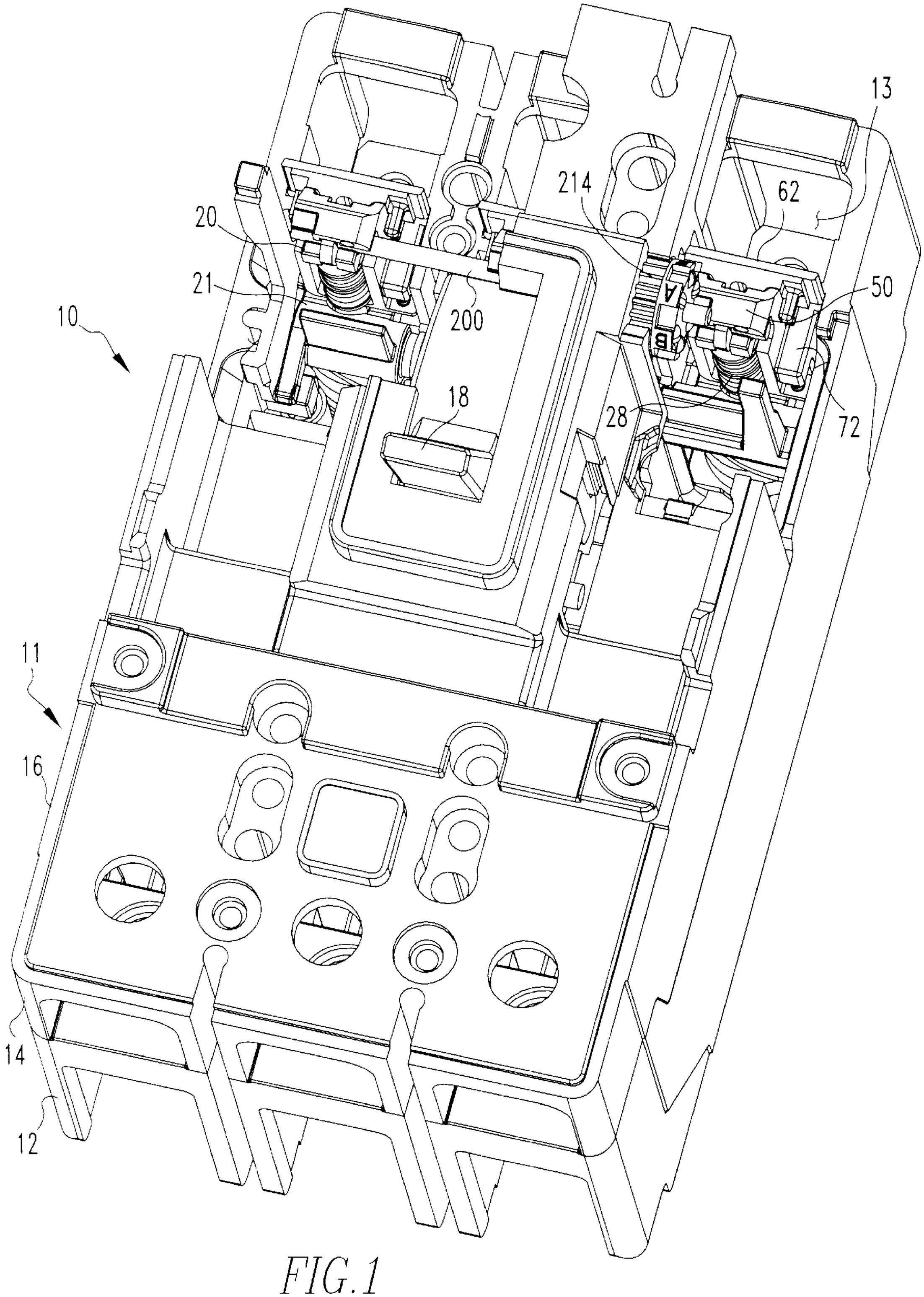
FIG. 1 is a partial cut away view of a circuit breaker housing incorporating the plunger carriage according to the present invention.
Figure 2:
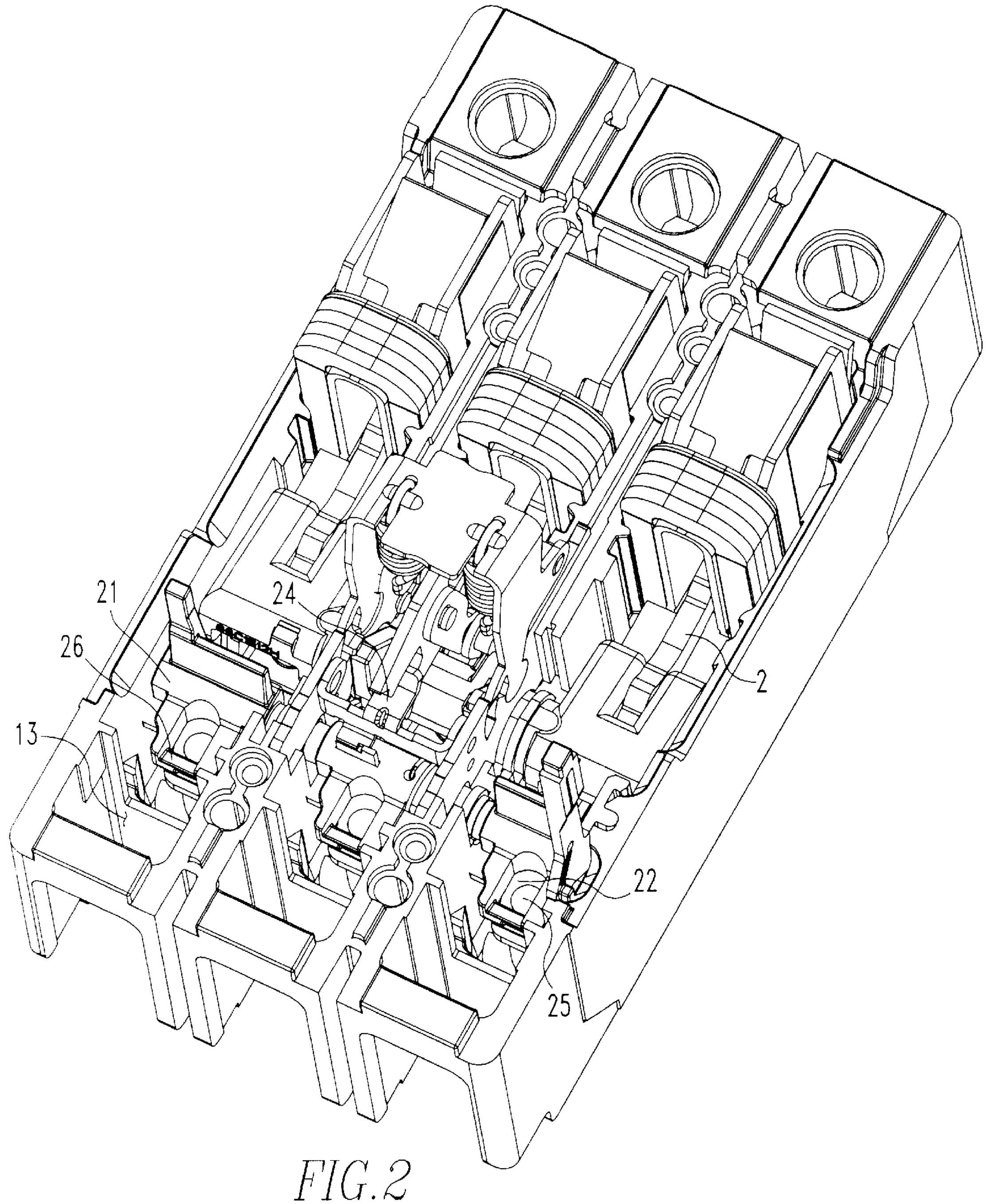
FIG. 2 is an isometric view of a circuit breaker with the top covers and plunger carriages removed.
Figure 3:
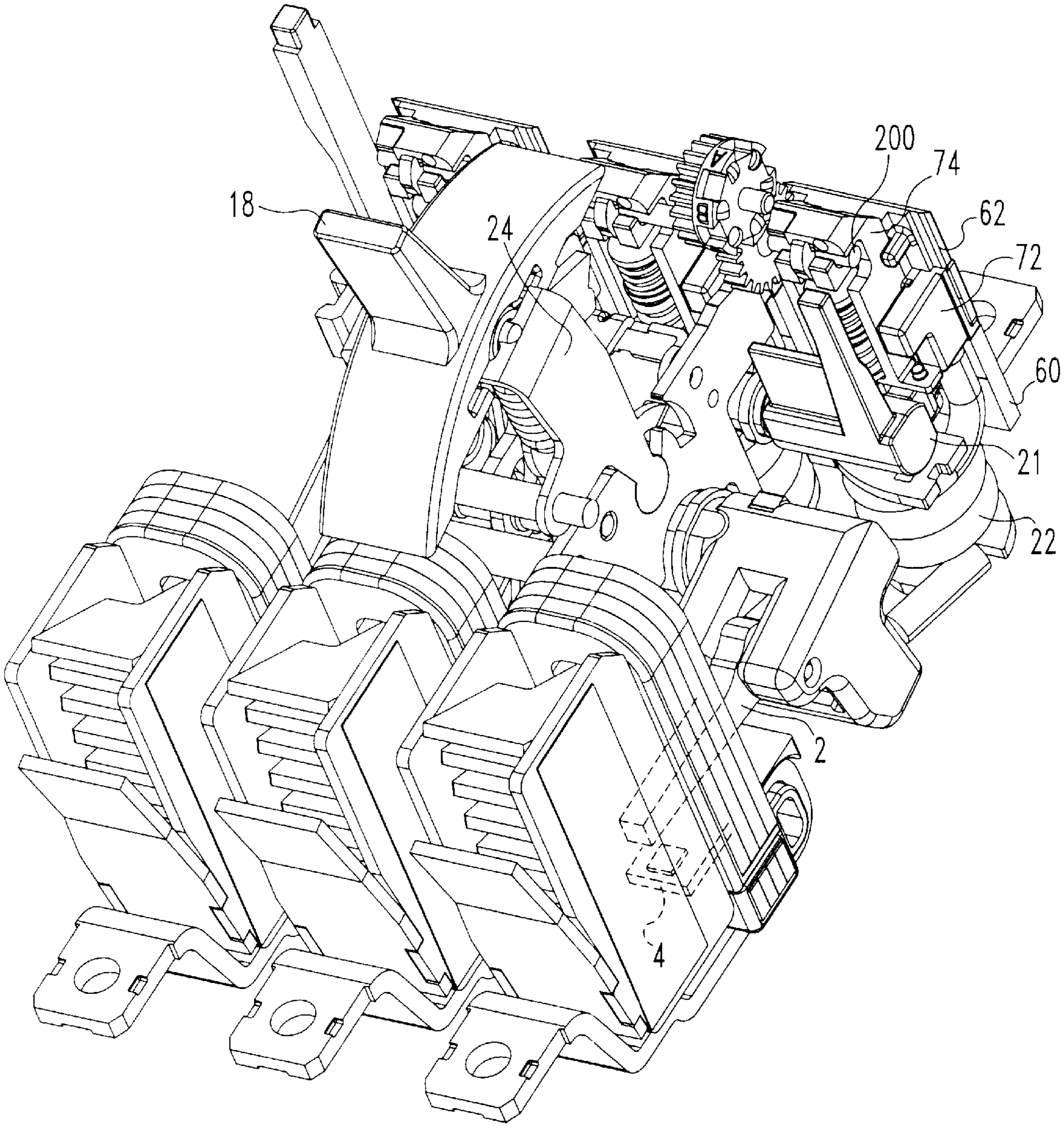
FIG. 3 is an isometric view of the circuit breaker mechanism without the circuit breaker housing.

Referring to the drawings, FIG. 1 shows a molded case circuit breaker 10 according to a preferred embodiment of the present invention. The molded case circuit breaker has a housing 11, which includes a base portion 12 which is coupled to a primary cover 14. Base portion 12 includes a plurality of cavities 13 which support the circuit breaker components (described below). Disposed on top of primary cover 14 is a secondary cover 16. An operating handle 18 protrudes through secondary cover 16. As shown in FIGS. 2 and 3, at least one pair of main contacts 2, 4 are disposed within housing 11. The contacts include a moveable contact 2, and a stationary contact 4. The movable contact 2 is coupled to and is in electrical communication with the load side of the circuit breaker 10. The stationary contact 4 is coupled to and is in electrical communication with an electrical line (not shown). Handle 18 is coupled to a moveable contact 2 within the circuit breaker housing 11. Handle 18 may be used to reset the circuit breaker 10 after it has been tripped or may be used to manually open or close the circuit breaker 10.

The circuit breaker 10 may be tripped by a separate magnetic trip assembly 20. The magnetic trip assembly 20 cooperates with a rotating trip bar 21, which is coupled to a latchable operating mechanism 24. As is known in the prior art, rotation of trip bar 21 will release the latchable operating mechanism 24 allowing the circuit breaker 10 to trip. The trip bar 21 includes at least one actuating arm 26, which is adjacent to the magnetic trip assembly 20.

The magnetic trip assembly 20 includes a stationary core 22, a plunger assembly 28 and a plunger assembly support structure 50. Stationary core 22 is disposed within a cavity 13 in the bottom housing 12 and forms a portion of the load circuit through the breaker 10. The stationary core 22 is preferably shaped as a coil. The stationary core 22 includes a medial aperture 25, preferably having a circular cross-section. The stationary core 22 is disposed between the moveable main contact 2 and a load side of the breaker 10. When electricity flows through the stationary core 22 a magnetic field generating a magnetic force is created.

Figure 4:
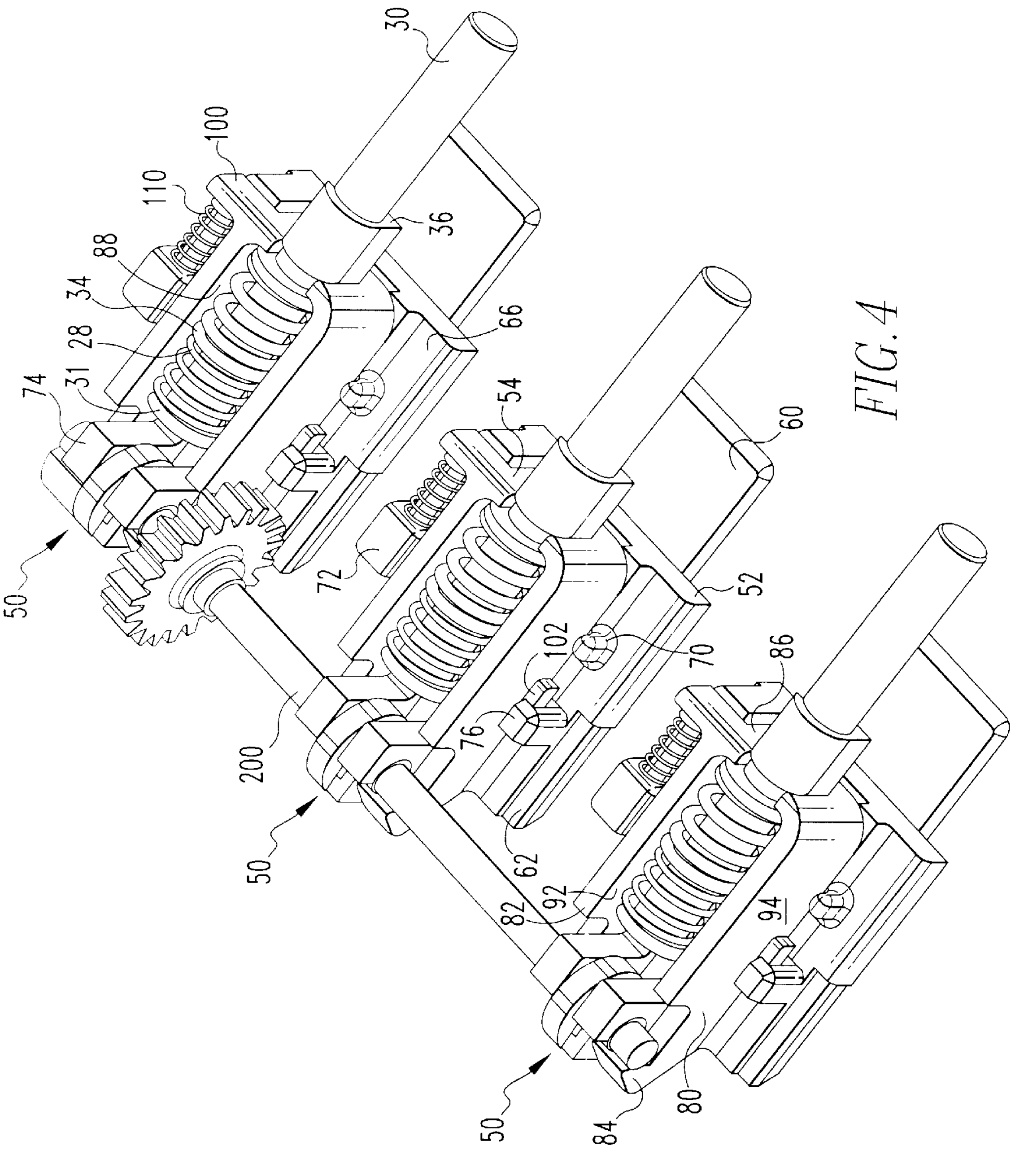
FIG. 4 is an isometric view of a plurality of plunger carriage support structure according to the present invention.

FIG. 4 shows a plurality of plunger assembly support structures 50 linked to each other by cam shaft 200. For ease of identification, certain components are identified on separate units, however, it is understood each unit includes each identified component. Plunger assembly 28 includes a moveable core 30 having a flattened end 31, a coil spring 34 and a plunger tab 36. The movable core 30 is preferably a solid metal cylinder. Coil spring 34 is disposed about moveable core 30. As shown on FIGS. 2 and 3, the plunger assembly 28 is disposed within cavity 88 of plunger assembly support structure 50 (described below). One end of coil spring 34 contacts flattened end 31 while the other end contacts the support structure 50.

Figure 5:
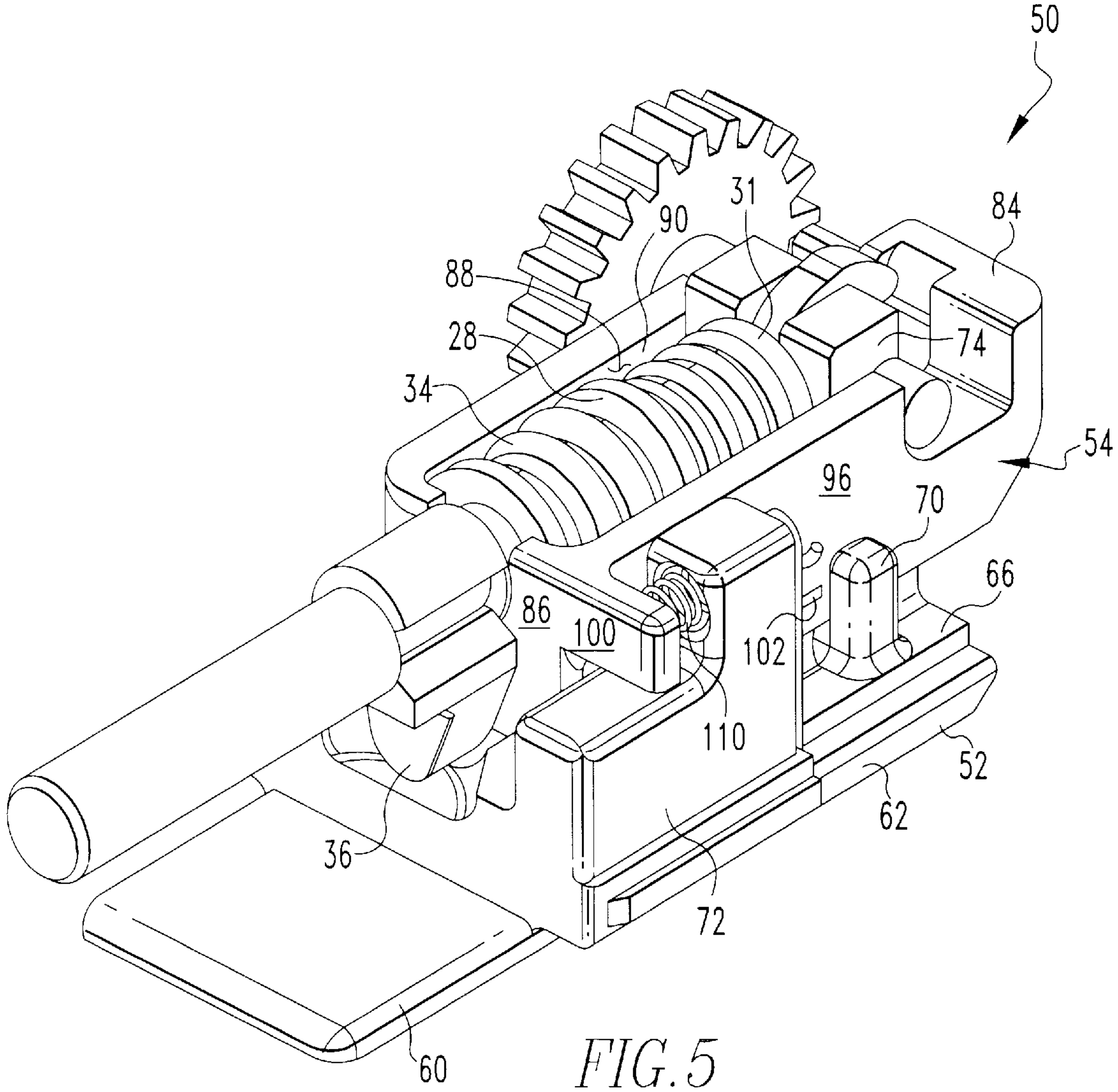
FIG. 5 is an isometric view of a single plunger carriage support structure according to the present invention.
Figure 6:
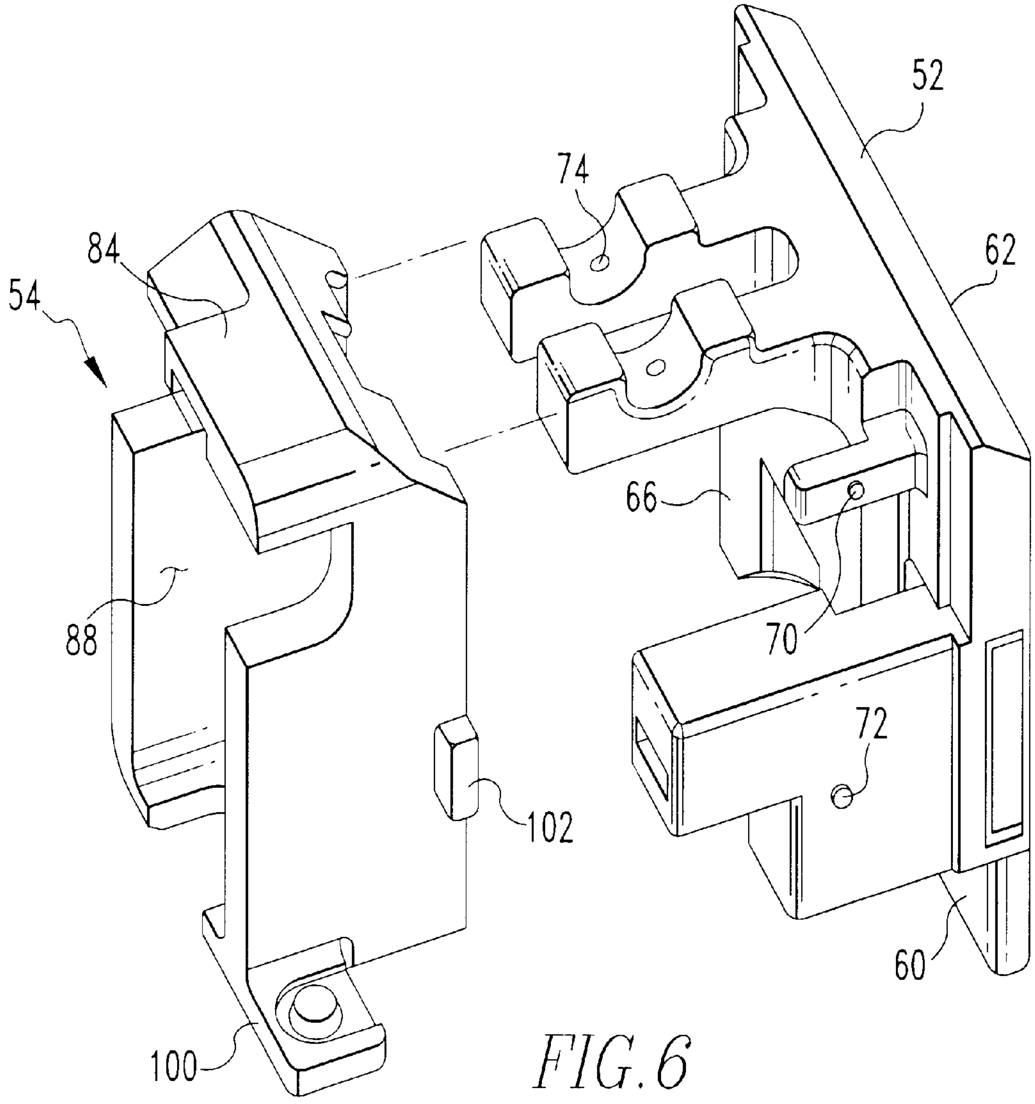
FIG. 6 is an exploded view of the plunger carriage according to the present invention.

As shown in FIGS. 4–6, the plunger assembly support assembly 50 includes a base member assembly 52 and a plunger carriage assembly 54. The plunger assembly 28 is disposed within the plunger carriage assembly 54. The plunger carriage assembly 54 is slidably disposed adjacent to the base member assembly 52. The plunger carriage assembly 54 is slidable so that the distance between the moveable core 30 and the stationary core 22, and therefore the trip condition of the circuit breaker 10, may be selectively adjusted.

Base member assembly 52 includes a mounting tab 60, a body 62 having a first face 66. The base member 52 further includes a plurality of guides 70 extending from the body first face 66. The guides 70 are spaced to fit on either side of the plunger carriage assembly 54 (described below). The guides 70 are positioned so that at least two guides 70 are on one side of plunger carriage assembly 54, and at least one guide 70 is on the opposite side of plunger carriage assembly 54. Body 62 further includes a spring housing 72 extending from the body first face 66. Any of the guides 70 or spring housing 72 may include guide grooves 76 shaped to cooperate with an alignment ridge 102 (described below). The body 62 also includes a camshaft nest 74.

Figure 7:
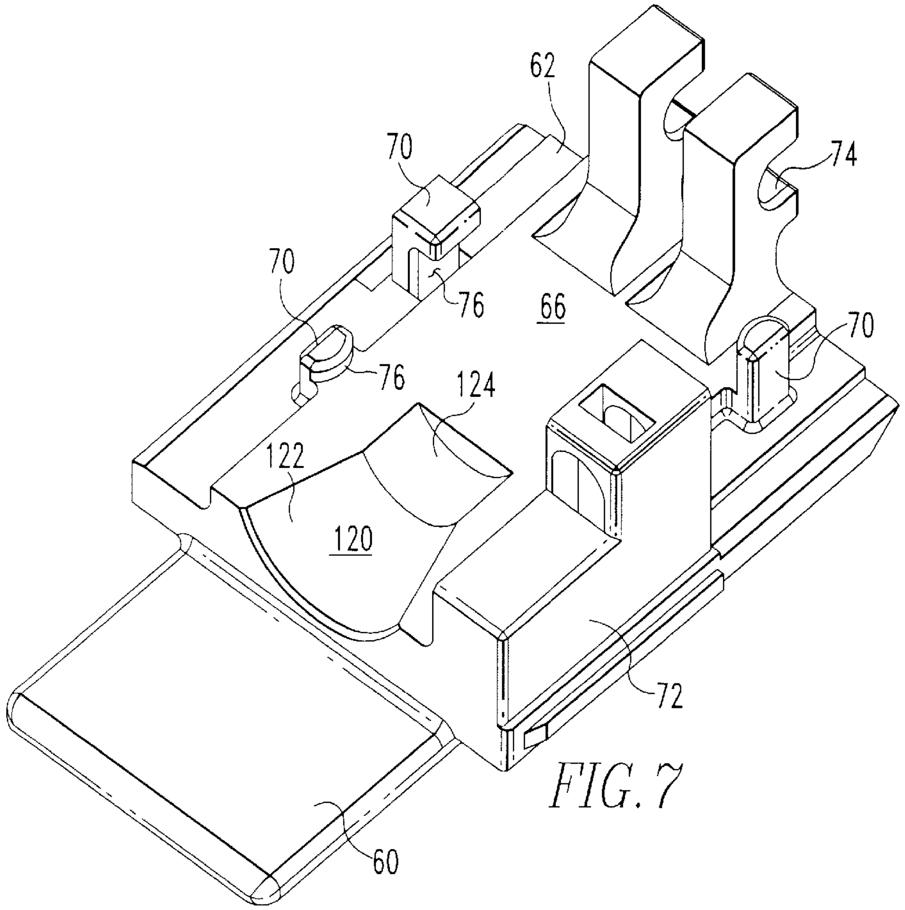
FIG. 7 is an isometric view of the plunger locator feature.
Figure 8:
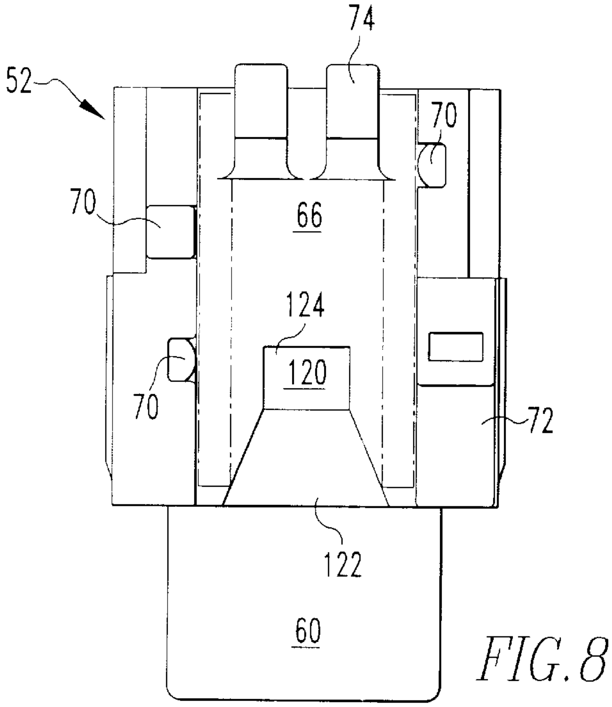
FIG. 8 is a front view of the plunger locator feature.

As shown in FIGS. 7 and 8, the housing body 62 includes a plunger guide 120, which, during movement of the plunger carriage assembly 54, automatically realigns the plunger tab 36 with the actuating arm 26. The plunger guide 120 includes a conical cut out 122 located on the body first face 66. The conical indentation 122 is positioned on the body first face 66 so that it will be adjacent to the plunger tab 36 when the moveable core 30 is disposed within cavity 88. The wide end of the conical indentation 122 is adjacent to tab 60. The conical indentation 122 may also include a plunger trough 124 extending from the narrow portion of the conical indentation 122 toward camshaft nest 74.

The plunger carriage assembly 54 includes a first side member 80 and a second side member 82, shown in FIGS. 3 and 4. The first side member 80 and the second side member 82 are held in spaced relation by a top member 84 and a bottom member 86. An open-faced cavity 88 is formed between the first side member 80 and the second side member 82. Both the first side member 80 and the second side member 82 each have an interior side 90 (FIG. 5), 92 (FIG. 4) and an exterior side 94 (FIG. 4), 96 (FIG. 5) respectively. The second side member exterior side 96 includes a spring tab 100 extending therefrom. The first side member exterior side 94 has an alignment ridge 102 (FIG. 4). The second side member exterior side 96 also has an alignment ridge 102 (FIG. 5). As will be described below, the alignment ridges 102 are disposed in guide grooves 76 when the plunger carriage assembly 54 is disposed adjacent to base member assembly 52.

As noted above, the plunger carriage assembly 54 is slidably disposed adjacent to base member assembly 52. The plunger carriage assembly 54 is slidable between a first and second position. In the first position, bottom member 86 is located the maximum distance from camshaft nest 74. In the second position, bottom member 86 is located the minimum distance from camshaft nest 74. The plunger carriage assembly 54 is disposed adjacent to base member assembly 52 such that two guides 70 are adjacent to and contacting first side member exterior side 94 and one guide 70 and spring housing 72 are adjacent to and contacting second side member exterior side 96. Alignment ridges 102 are disposed within guide grooves 76. Alignment ridges 102 have a sufficient length so that a portion of alignment ridge 102 remains in guide groove 76 as plunger carriage assembly 54 slides between the first and second positions. When coupled in this fashion, the plunger carriage assembly 54 is maintained in alignment relative to the base member assembly 52 by virtue of at least three contact points on side exterior surfaces 94, 96. Additionally, alignment ridges 102 cooperate with guide grooves 76 to prevent the plunger carriage assembly 54 from separating from body 62 in a direction normal to first face 66.

A spring member 110 may be disposed between the spring housing 72 and spring tab 100. In the preferred embodiment, a helical compression spring is used. The spring biases the plunger carriage assembly 54 in the first position.

The strength of the magnetic force, which changes in relation to the amount of current through stationary core 22, necessarily acting on the plunger assembly 28 is a function of the distance between the stationary core 22 and the moveable core 30. Accordingly, the over-current situation for breaker 10 may be adjusted by moving the moveable core 30 closer or further from the stationary core 22. When the moveable core 30 is closer to stationary core 22, the strength of the magnetic force, and therefore the amount of current through stationary core 22, required to overcome the bias of coil spring 34 is reduced as compared to the magnetic force, and therefore current through stationary core 22, required to overcome the bias of coil spring 34 when moveable core 30 is further from stationary core 22. The plunger carriage assembly 54, which supports the plunger assembly 28 and moveable core 30, is slidably disposed adjacent to base member assembly 52 to accomplish this adjustment.

In operation plunger assembly support structure 50 may be coupled to the circuit breaker housing 11 in a base portion cavity 13. Tab 60 cooperates with cavity 13 to position plunger assembly support structure 50 so that the end of moveable core 30 opposite flattened end 31 is partially disposed in stationary core aperture 25. When so disposed, the magnetic force generated by electric current through stationary core 22 acts on moveable core 30 of plunger assembly 28, as explained above. Additionally, when plunger assembly support structure 50 is coupled to cavity 13, plunger tab 36 is positioned adjacent to trip bar actuating arm 26. Under normal operating conditions, coil spring 34 overcomes the magnetic force created by the electric current through stationary core 22 and biases flattened end 31 of moveable core away from plunger carriage bottom member 86 and stationary coil 22. The biasing force of coil spring 34 also prevents plunger tab 36 from engaging trip bar actuating arm 26.

When an over-current situation occurs, however, the magnetic force created by the current through stationary core 22 increases in strength. When the magnetic force becomes strong enough to overcome the bias of coil spring 34, the plunger assembly 28 is drawn towards stationary core 22. As the plunger assembly 28 is drawn towards stationary core 22, plunger tab 36 engages trip bar actuating arm 26 causing the trip bar 21 to rotate clockwise as view in FIG. 3. When trip bar 21 rotates, latchable operating mechanism 24 is released allowing the circuit breaker 10 to trip. When the plunger assembly 28 moves, either because of an over-current or due to adjustment by a user, but for the guides 70 the plunger assembly 28 may become misaligned relative to the stationary core 22 or the trip bar actuating arm 26. Guides 70 maintains the alignment of plunger carriage assembly 54, and therefore the plunger assembly 28, relative to the stationary core 22 or the trip bar actuating arm 26. Additionally, alignment ridges 102 cooperate with guide grooves 76 to prevent the plunger carriage assembly 54 from separating from body 62 in a direction normal to first face 66.

Alignment of the plunger assembly 28 within the plunger carriage assembly 54 is accomplished by a plunger guide 120 on body 62. During the use of the trip mechanism, it is possible for the moveable core 30 to rotate axially, thereby allowing plunger tab 36 to move out of alignment with the actuating arm 26. The plunger tab 36 contacts the plunger guide 120. Conical indentation 122 becomes narrower as it extends toward camshaft nest 74. As the plunger carriage assembly 54 travels from the first position towards the second position, the plunger tab 36 contacting the conical indentation 122 rotates the moveable core 30 so that the plunger tab 36 is aligned with the actuating arm 26.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A plunger assembly support structure and alignment device for a plunger assembly of a molded case circuit breaker magnetic trip mechanism, said support structure comprising:

a base member assembly having a plurality of guide members;

a plunger assembly;

a plunger carriage assembly disposed on said plunger assembly and slidably disposed adjacent to said base member assembly;

said plunger carriage assembly has a first side member and a second side member;

at least two said guide members are located on one side of said plunger carriage assembly and at least one said guide member is located on the opposite side of said plunger carriage assembly;

said guide members contact said plunger carriage assembly in at least two locations;

said base member assembly has a first face;

said guide members extent from said first face;

said plunger carriage assembly first side member and second side member each have an outer face;

said side members include at least one ridge on said first member outer face or second member outer face;

at least one said guide member having a groove adjacent to said at least one ridge; and said at lest one ridge disposed within said at least one groove.

2. The support structure of claim 1, wherein:

said first side member outer face and second side member outer face each have at least one ridge;

at least one said guide member having a groove adjacent to said at least one ridge on said first side member outer face;

at least one said guide member having a groove adjacent to said at least one ridge on said second side member outer face;

each said ridge disposed within a single said guide member groove.

3. The support structure of claim 2, wherein:

said base member assembly includes four guide members;

two said guide members located adjacent to said first side member outer face; and two said guide members located adjacent to said second side member outer face.

4. The support structure of claim 3, wherein:

said guide members are spaced apart from each other.

5. The support structure of claim 4, wherein:

said base member assembly includes a means for maintaining the rotational alignment of the plunger assembly.

6. The support structure of claim 5, wherein:

said means for maintaining the rotational alignment of the plunger assembly includes:

a conical indentation on said first face;

said plunger assembly includes a plunger tab;

said plunger assembly disposed in said carriage assembly with said plunger tab disposed adjacent to said conical indentation.

7. The support structure of claim 5, wherein:

said conical indentation includes a plunger trough extending in the direction of travel of said plunger carriage assembly.

8. A plunger assembly support structure and alignment device for a plunger assembly of a molded case circuit breaker magnetic trip mechanism, said support structure comprising:

a base member assembly having a plurality of guide members;

a plunger assembly a plunger carriage assembly disposed on said plunger assembly and slidably disposed adjacent to said base member assembly;

said base member assembly has a first face;

said base member assembly includes a means for maintaining the rotational alignment of the plunger assembly said means for maintaining the rotational alignment of the plunger assembly includes:

a conical indentation on said first face;

said plunger assembly includes a plunger tab; and said plunger assembly disposed in said carriage assembly with said plunger tab disposed adjacent to said conical indentation.

9. The support structure of claim 8, wherein:

said conical indentation includes a plunger trough extending in the direction of travel of said plunger carriage assembly.

10. A circuit breaker having a magnetic trip mechanism, said circuit breaker comprising:

a housing;

at least one pair of contacts disposed in said housing;

a latchable operating mechanism structured to separate said at least one pair of contacts;

a magnetic trip mechanism coupled to said latchable operating mechanism, having a plunger assembly support structure and a plunger assembly;

said plunger assembly support structure having a base member assembly having a plurality of guide members, a plunger carriage assembly sidably disposed adjacent to said base member assembly, means for aligning said carriage assembly, and said means for aligning said carriage assembly cooperating with said guide members to align said carriage relative to said base member assembly;

said plunger carriage assembly has a first side member and a second side member;

at least two said guide members are located on one side of said plunger carriage assembly and at lest one said guide member is located on the opposite side of said plunger carriage assembly;

said guide members contact said plunger carriage assembly in at least two locations said base member assembly has a first face;

said guide members extend from said first face;

said plunger carriage assembly first side member and second side member each have an outer face;

said side members include at least one ridge on said first member outer face or second member outer face;

at least one said guide member having a groove adjacent to said at least on ridge; and said at least one ridge disposed within said at least one groove.

11. The circuit breaker of claim 10, wherein:

said first side member outer face and second side member outer face each have at least one ridge;

at least one said guide member having a groove adjacent to said at least one ridge on said first side member outer face;

at least one said guide member having a groove adjacent to said at least one ridge on said second side member outer face;

each said ridge disposed within a single said guide member groove.

12. The circuit breaker of claim 11, wherein:

said base member assembly includes four guide members;

two said guide members located adjacent to said first side member outer face; and two said guide members located adjacent to said second side member outer face.

13. The circuit breaker of claim 12, wherein:

said guide members are spaced apart from each other.

14. The circuit breaker of claim 13, wherein:

said base member assembly includes a means for maintaining the rotational alignment of the plunger assembly.

15. The circuit breaker of claim 14, wherein:

said means for maintaining the rotational alignment of the plunger assembly includes:

a conical indentation on said first face;

said plunger assembly includes a plunger tab;

said plunger assembly disposed in said carriage assembly with said plunger tab disposed adjacent to said conical indentation.

16. The circuit breaker of claim 15, wherein:

said conical indentation includes a plunger trough extending in the direction of travel of said plunger carriage assembly.

17. A circuit breaker having a magnetic trip mechanism, said circuit breaker comprising:

a housing;

at least one pair of contacts disposed in said housing;

a latchable operating mechanism structured to separate said at least one pair of contacts;

a magnetic trip mechanism coupled to said latchable operating mechanism, having a plunger assembly support structure and a plunger assembly;

said plunger assembly support structure having a base member assembly having a plurality of guide members, a plunger carriage assembly slidably disposed adjacent to said base member assembly, means for aligning said carriage assembly, and said means for aligning said carriage assembly cooperating with said guide members to align said carriage relative to said base member assembly;

said base member assembly has a first face;

said base member assembly includes a means for maintaining the rotational alignment of the plunger assembly;

said means for maintaining the rotational alignment of the plunger assembly includes:

a conical indentation on said first face;

said plunger assembly includes a plunger tab; and said plunger assembly disposed in said carriage assembly with said plunger tab disposed adjacent to said conical indentation.

18. The circuit breaker of claim 17, wherein:

said conical indentation includes a plunger trough extending in the direction of travel of said plunger carriage assembly.

* * * * *